United States Patent
Taibi et al.

(10) Patent No.: US 8,916,393 B2
(45) Date of Patent: Dec. 23, 2014

(54) METHOD FOR ESTIMATING THE DIFFUSION LENGTH OF METALLIC SPECIES WITHIN A THREE-DIMENSIONAL INTEGRATED STRUCTURE, AND CORRESPONDING THREE-DIMENSIONAL INTEGRATED STRUCTURE

(71) Applicants: STMicroelectronics SA, Montrouge (FR); STMicroelectronics (Crolles 2) SAS, Crolles (FR)

(72) Inventors: Rachid Taibi, Marseille (FR); Cedrick Chappaz, Pontcharra (FR); Lea Di Cioccio, Ismier (FR); Laurent-Luc Chapelon, Domene (FR)

(73) Assignees: STMicroelectronics SA, Montrouge (FR); STMicroelectronics (Crolles 2) SAS, Crolles (FR)

( * ) Notice: Subject to any disclaimer, the term of this patent is extended or adjusted under 35 U.S.C. 154(b) by 165 days.

(21) Appl. No.: 13/624,214

(22) Filed: Sep. 21, 2012

(65) Prior Publication Data

US 2013/0181220 A1 Jul. 18, 2013

(30) Foreign Application Priority Data

Sep. 23, 2011 (FR) ...................................... 11 58501

(51) Int. Cl.
*H01L 21/66* (2006.01)
*H01L 27/06* (2006.01)

(52) U.S. Cl.
CPC ................. *H01L 22/14* (2013.01); *H01L 22/12* (2013.01); *H01L 27/0688* (2013.01); *H01L 2224/48463* (2013.01)
USPC ............................................... 438/17; 257/48

(58) Field of Classification Search
USPC ................................................ 438/17; 257/48
See application file for complete search history.

(56) References Cited

U.S. PATENT DOCUMENTS

| | | | |
|---|---|---|---|
| 5,872,018 A | 2/1999 | Lee | |
| 6,617,180 B1 | 9/2003 | Wang | |
| 2008/0173868 A1* | 7/2008 | Kwon | 257/48 |
| 2012/0242356 A1* | 9/2012 | Ohuchi et al. | 324/705 |

FOREIGN PATENT DOCUMENTS

| | | |
|---|---|---|
| EP | 1978371 | 10/2008 |
| WO | 2007051718 | 5/2007 |

* cited by examiner

*Primary Examiner* — Marc Armand
(74) *Attorney, Agent, or Firm* — Allen, Dyer, Doppelt, Milbrath & Gilchrist, P.A.

(57) ABSTRACT

A three-dimensional integrated structure may include two assembled integrated circuits respectively including two metallic lines, and at least two cavities passing through one of the integrated circuits and opening onto two locations respectively in electrical contact with the two metallic lines. The cavities may be sized to place a measuring apparatus at the bottom of the cavities, and in electrical contact with the two locations.

16 Claims, 7 Drawing Sheets

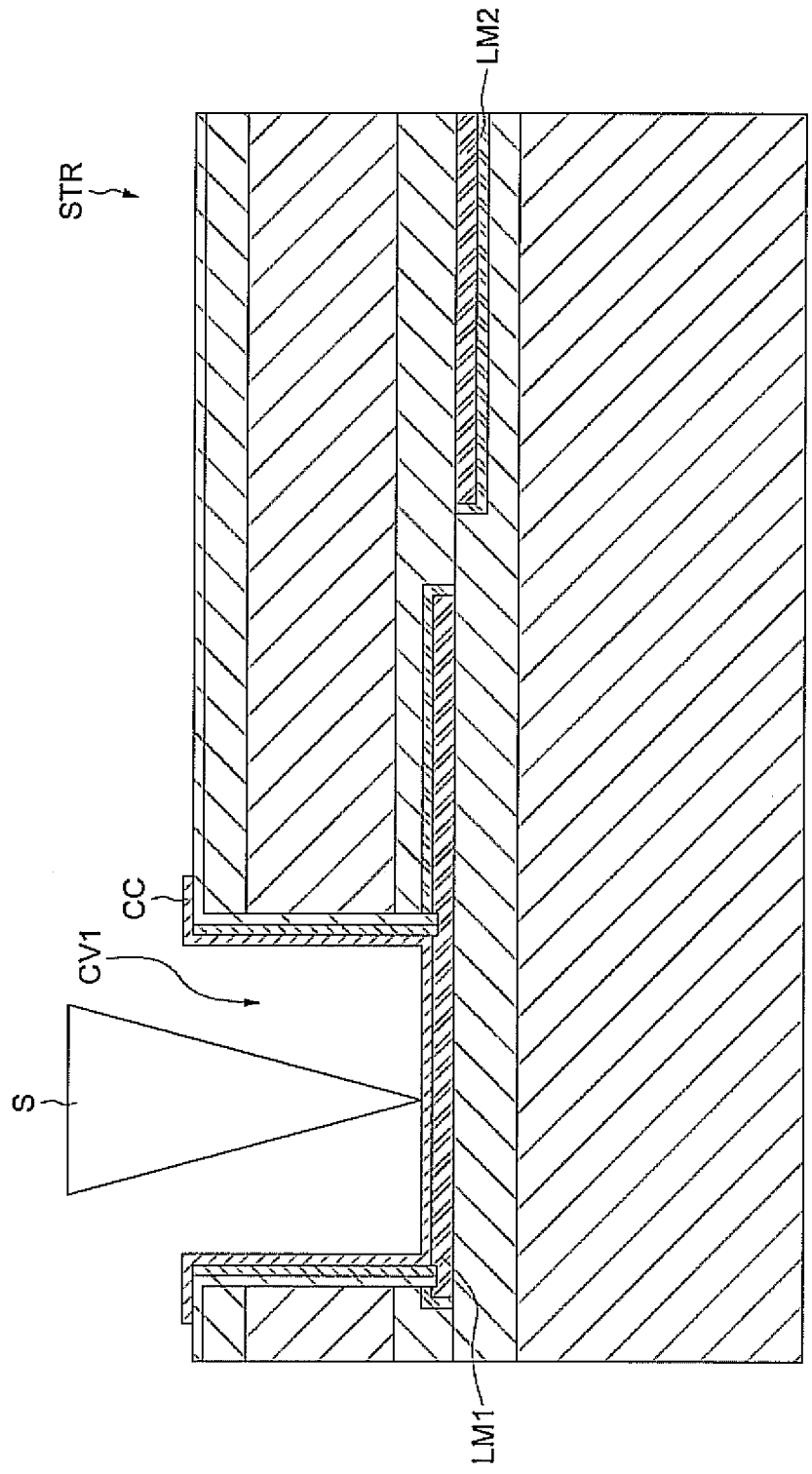

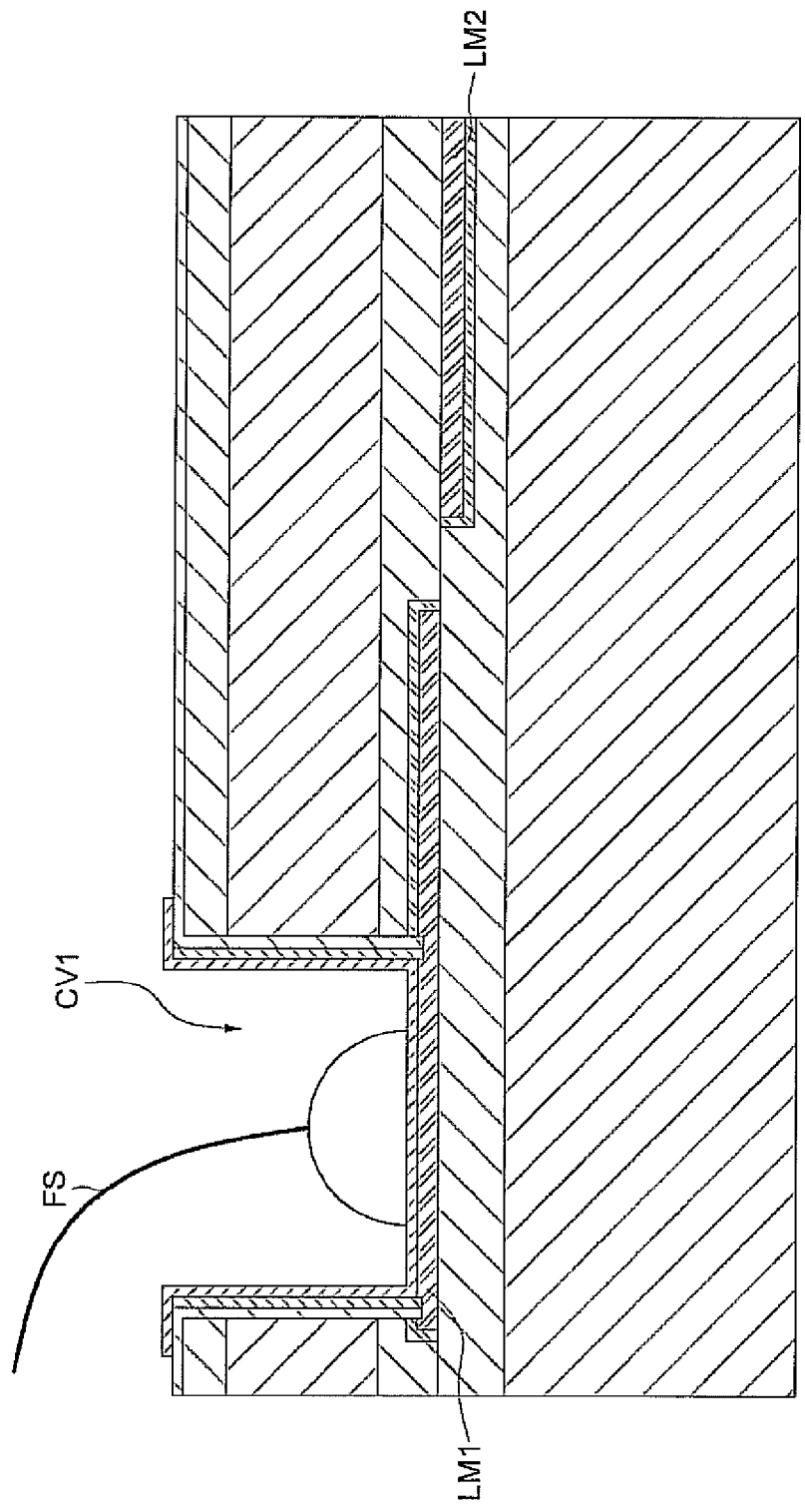

METHOD FOR ESTIMATING THE DIFFUSION LENGTH OF METALLIC SPECIES WITHIN A THREE-DIMENSIONAL INTEGRATED STRUCTURE, AND CORRESPONDING THREE-DIMENSIONAL INTEGRATED STRUCTURE

FIELD OF THE INVENTION

The invention relates to three-dimensional integrated structures and, more particularly, to estimation of the diffusion length between two metallic lines buried within such structures.

BACKGROUND OF THE INVENTION

In order to form a three-dimensional integrated structure, a first integrated circuit may be produced, comprising an insulating material, for example, silicon dioxide ($SiO_2$), on one face and metallic lines on this same face, for example, metallic lines of the highest level of an interconnection network (BEOL: Back End Of Line). A second integrated circuit having a similar structure may be assembled by direct bonding, or molecular bonding, directly on the face. This assembly corresponds to assembling silicon dioxide on silicon dioxide, assembling conductive material (generally copper) on conductive material (for the metallic lines of two different integrated circuits, which overlap), and assembling silicon dioxide on conductive material (for the metallic lines which do not overlap with other lines). The metallic lines which overlap thus form electrical connections between the two integrated circuits.

Not all the lines arranged in the vicinity of the front faces of the assembled integrated circuits are necessarily in contact with a line of another integrated circuit. It may be, in particular, desirable to separate the neighboring lines belonging to two different integrated circuits to reduce undesired contacts between two of these lines. These undesired contacts arise in the event of an alignment error or if the metallic species of at least one of the two lines diffuse towards the other line to form an electrical contact. This diffusion of metal atoms may occur after an anneal of the three-dimensional integrated structure, or during application of an electrical potential difference between the two lines, for example, during operation of the three-dimensional integrated structure.

For this reason, it may be desirable to estimate the diffusion length of the metallic species included in the metallic lines arranged in the vicinity of the interface between the integrated circuits. It has therefore been proposed to use transmission electron microscopy (TEM), electron energy loss spectroscopy (EELS), secondary ion mass spectrometry (SIMS), and liquid phase decomposition coupled to atomic absorption spectroscopy (LPDAAS) techniques.

These techniques have the drawback of being destructive. A three-dimensional integrated structure in which theses techniques have been carried out cannot be completed even if the diffusion length is sufficiently short to allow successful operation of the structure.

SUMMARY OF THE INVENTION

According to one embodiment and implementation, it is proposed to estimate the diffusion length of the metallic species between two metallic lines buried within a three-dimensional integrated structure, and to do so without rendering this structure unusable.

According to a particular embodiment, a method is provided for estimating the diffusion length of metallic species between two metallic lines buried within a three-dimensional integrated structure comprising two assembled integrated circuits, for example, the front face of an integrated circuit assembled on the front face of another integrated circuit, respectively including the two lines. The method may include forming of at least two cavities passing through one of the integrated circuits and opening onto two locations respectively in electrical contact with the two metallic lines.

The method may also include diffusing of the metallic species in the two metallic lines, and placing a measuring apparatus at the bottom of the cavities, in electrical contact with the two locations. The method may further include measuring the resistance between the two locations, the value of the resistance providing an estimate of the diffusion length.

The resistance between the two locations is thus measured directly at the bottom of the cavities, that is to say directly between the two lines if the two locations are situated inside the lines, or between two locations arranged on other metallic lines respectively in electrical contact with the two lines. The two metallic lines are advantageously arranged in the vicinity of the interface between the two integrated circuits and, for example, are arranged on the highest metallization level of each integrated circuit. These two lines may be intended to be separated, that is to say not to be in electrical contact.

The cavities which are formed are advantageously wide enough and shallow enough to allow the measuring apparatus to be placed in contact. To this end, cavities may be formed having a width of more than 80 microns and a height of the order of 15 microns (obtained by thinning the integrated circuit in which the cavities are formed). The electrically conductive through-connections, generally referred to by the acronym TSV (Through Silicon Via), generally have a width of the order of 5 microns with a height of 15 microns. The use of cavities is less expensive and simpler to carry out than the formation of connections of the TSV type dedicated to this estimation of the diffusion length.

It should be noted that a low resistance indicates that the diffusion length is at least greater than the distance separating the two metallic lines. The diffusion of the metallic species may comprise an anneal and/or application of an electrical potential difference between the two lines.

Advantageously, the method may furthermore comprise a measurement of the resistance between the two locations prior to the diffusion of the metallic species. Thus, the alignment errors causing the appearance of contacts between two lines intended to be separated can be detected. Furthermore, a prior measurement makes it possible to obtain a reference to be compared with the resistance measurement obtained after the diffusion of the metallic species.

The method may furthermore comprise formation of a conductive layer at the bottom and on the walls of the cavities, forming an electrical contact with the two portions. This conductive layer makes it possible to protect the metallic line. The metallic line portions generally include copper, and the conductive layer makes it possible to passivate the copper as well as the walls of the cavities. Pollution of the equipment by copper is thus limited, and the corrosion of copper is limited. This conductive layer may include aluminum.

The measuring apparatus may be placed respectively in direct or indirect contact with the two locations by two probe tips. The probe tips of a characterization apparatus used in microelectronics generally have widths of the order of 10 to 20 microns (width of the contact between the tip and a surface). The measurement can thus be carried out by placing the tips in contact, then withdrawing them after the measurement to carry out the same measurement on another integrated structure. The measuring apparatus may be placed at the bottom of the cavities by two welded wires (wire bonding) so as to be in direct or indirect contact with the two portions.

Another aspect provides a three-dimensional integrated structure comprising two metallic lines buried within the structure, two assembled integrated circuits respectively including the two lines, and at least two cavities passing through one of the integrated circuits and opening onto two locations respectively in electrical contact with the two metallic lines. The dimensions of the cavities make it possible to place a measuring apparatus at the bottom of the cavities, in electrical contact with the two locations. The width of the cavities may be more than 80 microns. The integrated structure may comprise a conductive layer at the bottom and on the walls of the cavities, forming an electrical contact with the two portions.

BRIEF DESCRIPTION OF THE DRAWINGS

FIG. 5 is a cross-sectional view of a structure similar to the structure of FIGS. 1 and 2 illustrating placement of a measuring apparatus.

FIG. 6 is a cross-sectional view of an integrated circuit structure according to an embodiment of the present invention illustrating a wire welded to the bottom of the cavity.

DETAILED DESCRIPTION OF THE PREFERRED EMBODIMENTS

Figure 1:
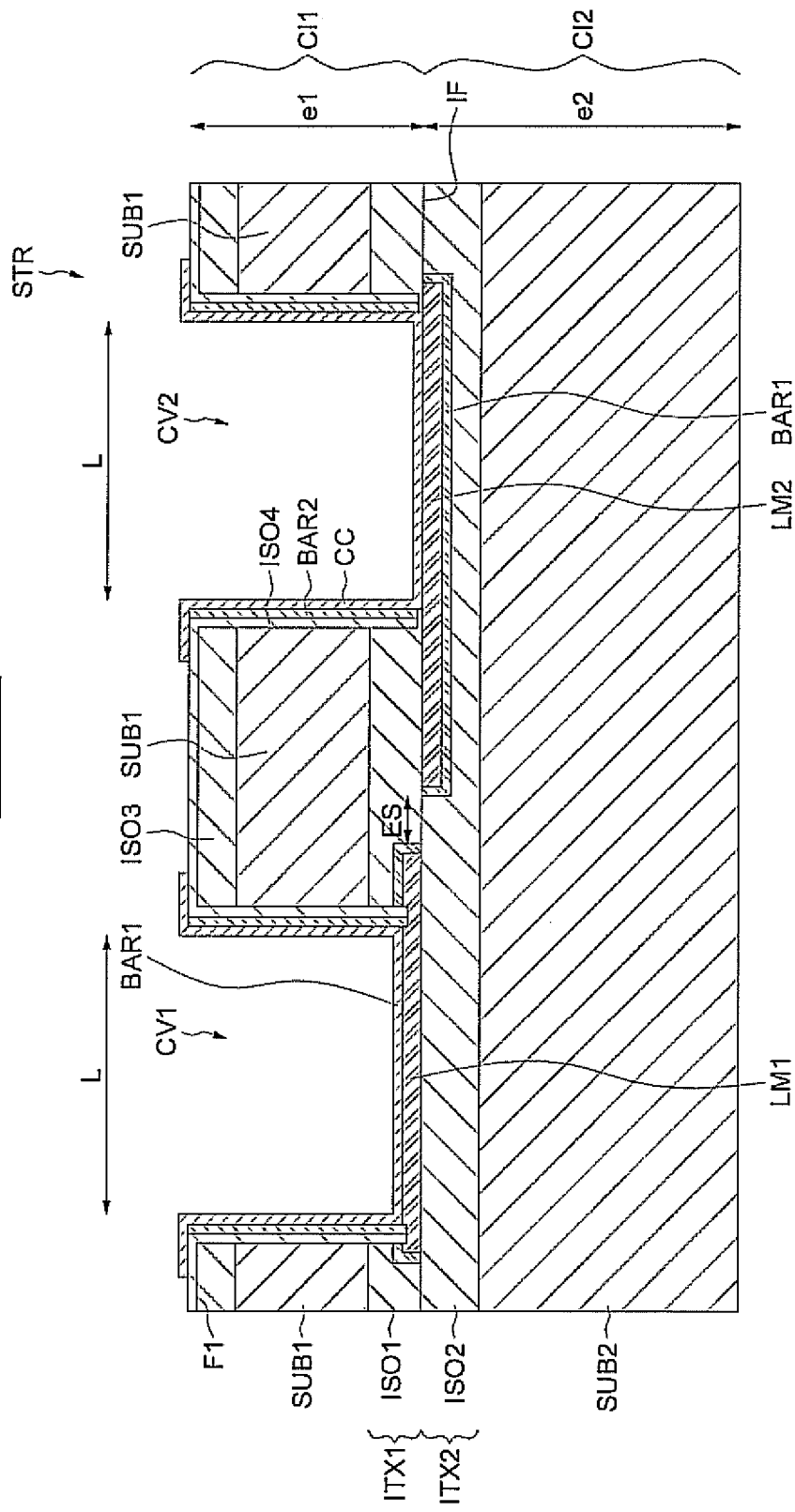
FIG. 1 is a cross-sectional view of an integrated circuit structure according to an embodiment of the present invention.

FIG. 1 illustrates an example of a three-dimensional integrated structure STR comprising two integrated circuits CI1 and CI2. The integrated circuits CI1 and CI2, respectively, comprise a substrate SUB1 and SUB2, for example, including silicon. The integrated circuits CI1 and CI2 also respectively comprise interconnection networks ITX1 and ITX2 (BEOL). The interconnection networks ITX1 and ITX2 comprise an insulating region ISO1, ISO2, for example, silicon dioxide, and a metallic line LM1, LM2, for example, copper, located on the highest metallization level of each integrated circuit CI1 and CI2, has been represented within each insulating region. The metallic lines LM1 and LM2 are partially encapsulated by a barrier layer BAR1, for example, a layer of titanium nitride (TiN) or a stack of tantalum nitride (TaN) and tantalum, and are not protected on the upper face of each integrated circuit CI1 and CI2. The upper faces of the integrated circuits CI1 and CI2 have been assembled along the interface IF.

The integrated circuits CI1 and CI2 may be assembled by direct bonding or molecular bonding, and corresponds here to assembly in which the layers ISO1 and 1302 have been placed in contact, and in which the metallic lines LM1 and LM2 have been placed in contact respectively with the insulating layer ISO2 and with the insulating layer ISO1. There may therefore be a risk that the metallic species of the lines LM1 and LM2 diffuse through the interface IF. The metallic lines LM1 and LM2 are intended to be separated, with a spacing denoted ES.

The integrated circuit CI1, having an initial thickness of the order of 700 microns, is thinned in order to reach a thickness e1 of the order of 15 microns. The thickness e2 of the integrated circuit CI2 is of the order of 700 microns. An insulating layer ISO3, for example, silicon dioxide ($SiO_2$), has also been formed on the rear face of the integrated circuit CI1. The insulating layer 1303 makes it possible to passivate the rear face of the integrated circuit CI1. In the figure, the reference F1 denotes the rear face of the integrated circuit CI1 after thinning and formation of the insulating layer 1303.

Two cavities CV1 and CV2 are formed in a conventional way on the face F1. The cavity CV1 passes through the insulating layer ISO3, the substrate SUB1, and the insulating layer ISO1, and opens onto the metallic line LM1. The cavity CV2 is deeper and passes entirely through the layer ISO1 to open onto the metallic line LM2.

To passivate the walls of the cavities, conformal deposition of an insulating layer ISO4, for example, silicon dioxide ($SiO_2$), is carried out on the face F1, on the walls of the cavities and at the bottom of the cavities, before being etched at the bottom of the cavities CV1 and CV2. The layer ISO4 passivates, in particular, the walls of the cavities CV1 and CV2.

A barrier BAR2, for example, a stack of titanium, titanium nitride, or titanium, is formed on the walls of the cavities CV1 and CV2 and partially on the face F1 covered with the layer ISO4 (etching may be carried out at the bottom of the cavities CV1 and CV2). The barrier BAR2 makes it possible to deposit a layer of a conductive material CC, for example, aluminum, at the bottom and on the walls of the cavities CV1 and CV2, and partially on the face F1 covered with the insulating layer ISO4 and with the barrier BAR1. The copper of the metallic lines LM1 and LM2 is thus protected, which reduces corrosion of the copper or pollution of equipment.

The cavities CV1 and CV2 have a width L of more than 80 microns. A measuring apparatus can thus be connected directly to the bottom of the cavities CV1 and CV2 to measure the resistance between the two locations, corresponding to the bottom of the cavities. A prior measurement of this resistance gives a very high value.

A three-dimensional integrated structure is obtained, comprising two metallic lines LM1 and LM2 buried within the structure STR, two assembled integrated circuits CI1 and CI2 respectively including the two lines, and at least two cavities CV1 and CV2 passing through one of the integrated circuits and opening onto two locations respectively in electrical contact with the two metallic lines LM1 and LM2. The dimensions of the cavities, that is to say the width L, make it possible to connect a measuring apparatus at the bottom of the cavities, in electrical contact with the two locations.

Figure 2:
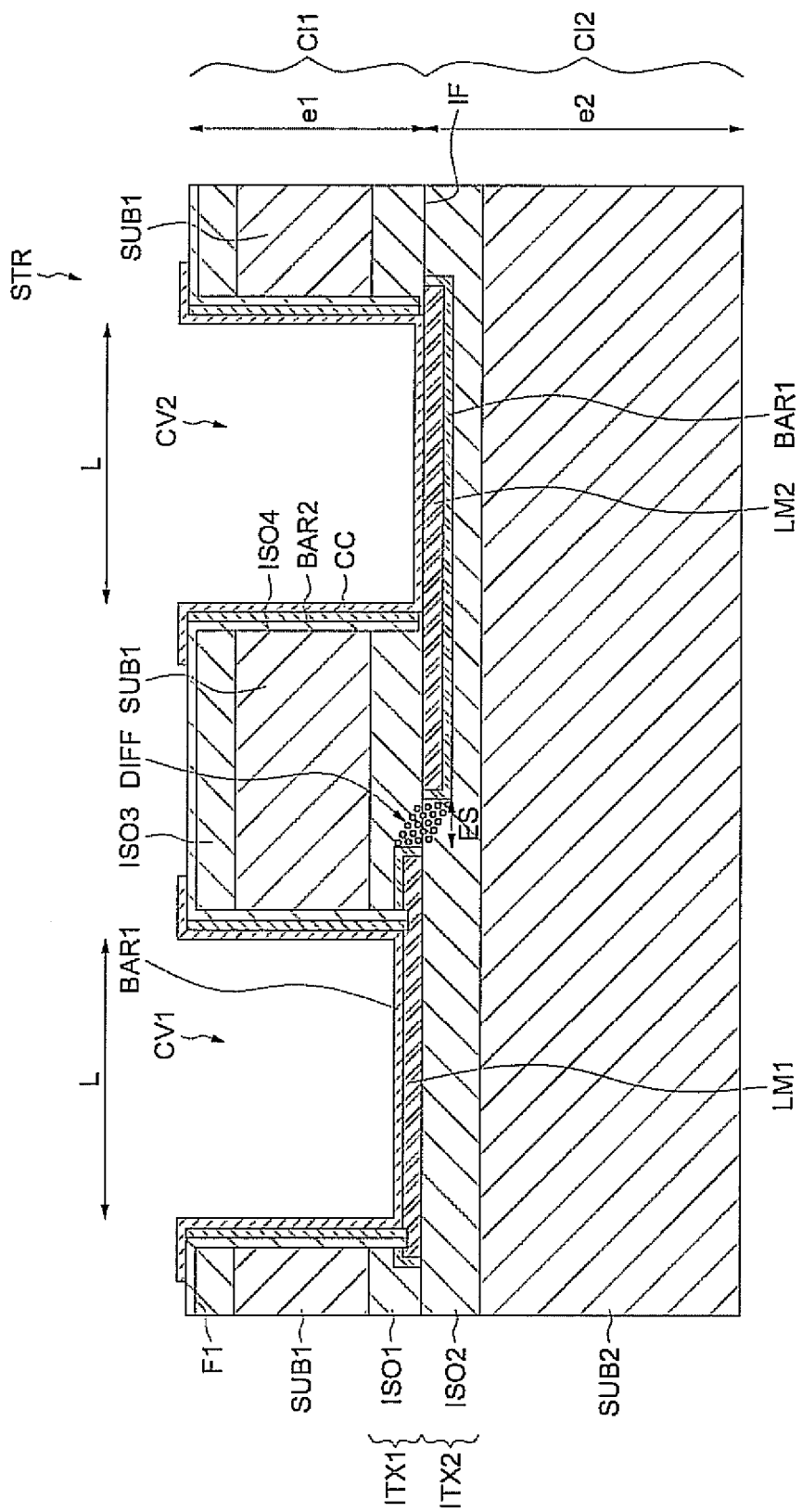
FIG. 2 is a cross-sectional view of the integrated circuit structure of FIG. 1 illustrating the application of a potential difference between the two lines.

Diffusion of the metallic species included in the two metallic lines can then be carried out. Thus, as illustrated in FIG. 2, the application of a potential difference between the two lines (applied through the cavities CV1 and CV2) and/or an anneal can make it possible for the metallic species of the two lines LM1 and LM2 to diffuse through the interface IF. A population DIFF of diffused metal atoms is thus obtained between the lines LM1 and LM2 on either side of the interface IF, as well as through the barriers BAR1 and BAR2. The population DIFF corresponds to a diffusion length ES at least greater than the spacing ES separating the two lines. A measurement of the resistance between the two points corresponding to the bottom of each cavity CV1 and CV2 will thus give a resistance value lower than that obtained during a prior measurement.

The formation of the cavities CV1 and CV2 is easier to carry out than the formation of through-connections of the TSV type, in particular because these cavities are not to be filled. Thus, those three-dimensional structures in which the diffusion length is too great can be rejected before producing the through-connections of the TSV type.

Figure 3:
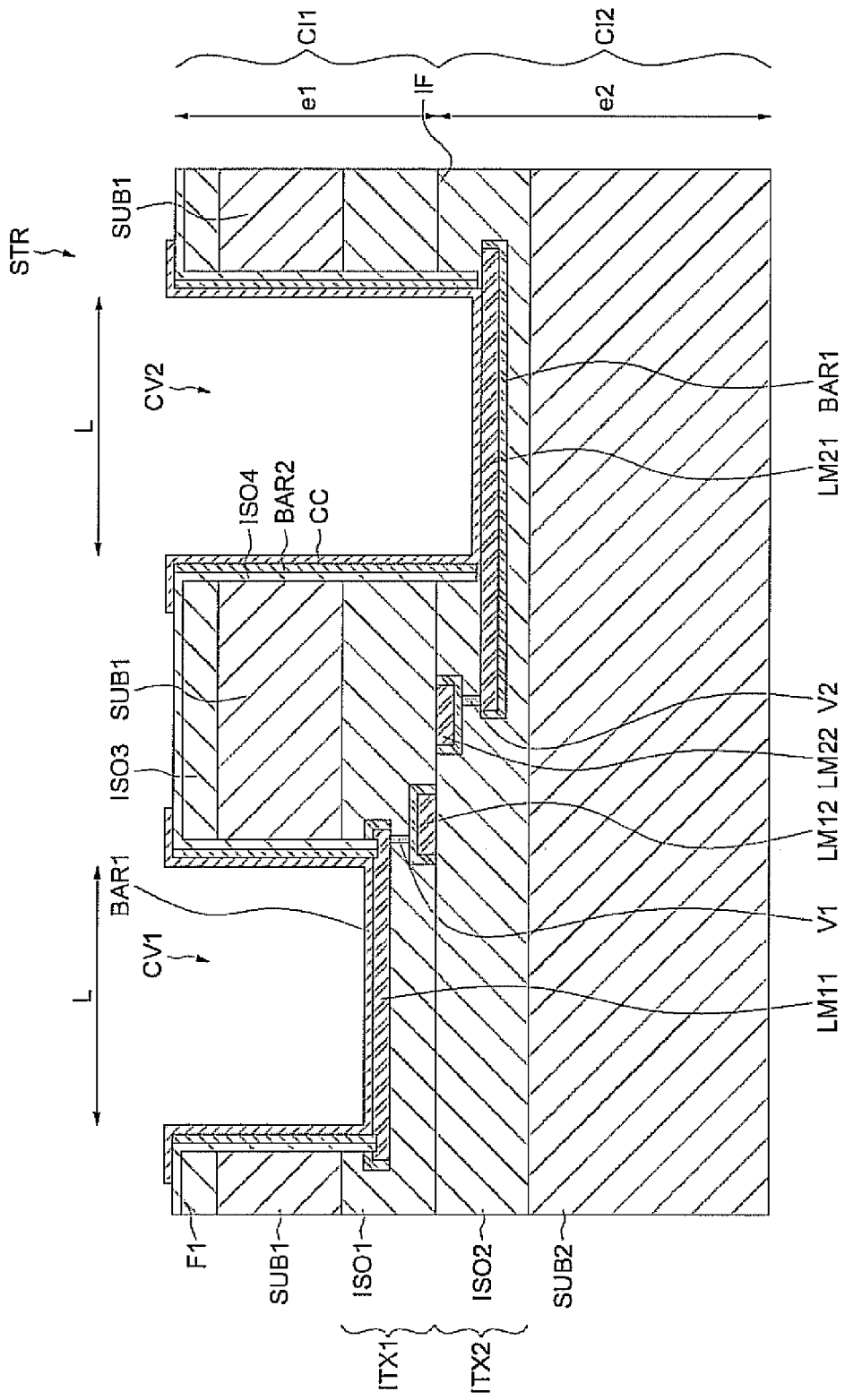
FIG. 3 is a is a cross-sectional view of an integrated circuit structure according to an embodiment of the present invention.

FIG. 3 illustrates an embodiment in which the cavities open onto two locations not situated on the metallic lines arranged in the vicinity of the interface. The cavity CV1 in this case opens onto a line LM11, connected by a via V1 to the line LM12 arranged in the vicinity of the interface IF. The cavity CV2 opens onto a line LM21 connected by a via V2 to a line LM22 arranged in the vicinity of the interface IF. It is between the two lines LM12 and LM22 that diffusion of metallic species may occur.

Figure 4:
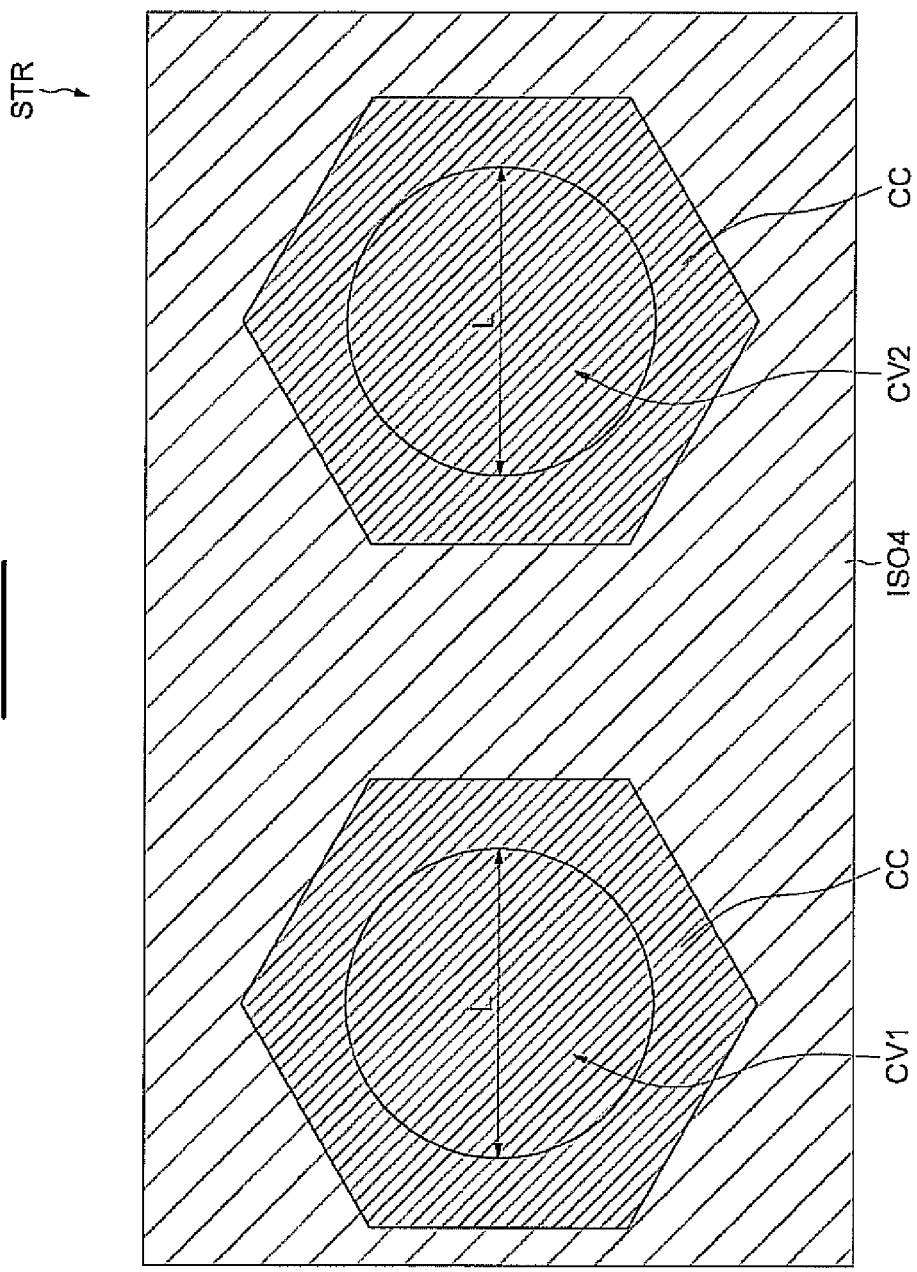
FIG. 4 is a plan view of an integrated circuit structure according to an embodiment of the present invention.
Figure 8:
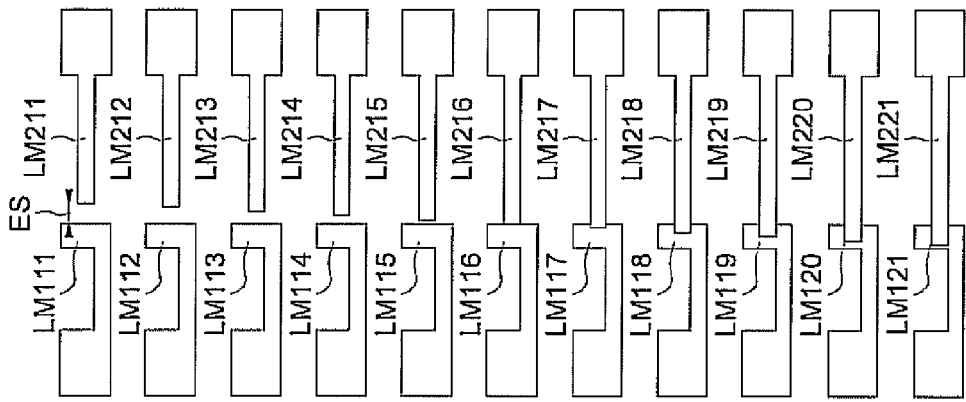
FIG. 8 is a plan view of metallic lines belonging to an integrated circuit and metallic lines belonging to another integrated circuit in accordance with another embodiment of the present invention.

FIG. 4 is a plan view of the structure STR. The two cavities CV1 and CV2 have been represented covered with the conductive layer CC arranged at the bottom of the cavities, on the walls of the cavities, and partially on the face F1 covered with the insulating layer ISO4. The cavities CV1 and CV2 may have a circular shape with a diameter L of more than 80 microns.

FIG. 5 illustrates placement of a measuring apparatus in contact with a structure similar to that described in FIGS. 1 and 2. A measuring apparatus may be placed in contact with the metallic line LM1 by a probe tip S. The probe tips, which are well known to the person skilled in the art, form a contact with a surface 20 microns wide. They are furthermore high enough to reach the bottom of the cavities (a height of the order of 15 microns). By way of example, a probe tip with a height of the order of 100 to 200 microns may be used. For example, the measuring apparatus "APM90" from the Japanese company ACCRETECH may be used. The tip is in direct contact with the conductive layer CC, at the bottom of the cavities, and optionally on the walls of the cavities if the alignment of the probe and the cavity is not perfect.

FIG. 6 illustrates an embodiment in which a wire FS has been welded to the bottom of the cavity CV1. A wire can thus be electrically connected, forming a direct or indirect contact with the line LM1, for example, through the conductive layer CC.

Figure 7:
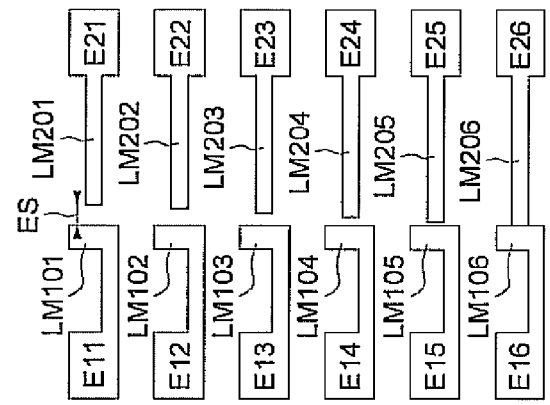
FIG. 7 is a plan view of metallic lines belonging to an integrated circuit and metallic lines belonging to another integrated circuit in accordance with an embodiment of the present invention.

The structures illustrated in FIGS. 1-6 make it possible to compare the diffusion length of the metallic species with the spacing ES separating the two lines LM1 and LM2. It is also possible to refine this estimate by carrying out a plurality of measurements within the same integrated circuit, as illustrated in FIG. 7. This figure illustrates a plan view of metallic lines LM101, LM102, LM103, LM104, LM105 and LM106 belonging to one integrated circuit and metallic lines LM201, LM202, LM203, LM204, LM205 and LM206 belonging to another integrated circuit and intended to be arranged respectively facing the lines LM101, LM102, LM103, LM104, LM105 and LM106. Cavities have been formed on one face of one of the integrated circuits, opening onto the locations E11, E12, E13, E14, E15, E16, E21, E22, E23, E24, E25, E26 respectively in electrical contact with the lines LM101 to LM106 and LM201 to LM206.

The spacing ES separating the pairs of lines is in this case modified for each pair of lines. By way of non-limiting example, the lines LM101 and LM201 are separated by 250 nanometers, the lines LM102 and LM202 are separated by 200 nanometers, the lines LM103 and LM203 are separated by 150 nanometers, the lines LM104 and LM204 are separated by 100 nanometers, the lines LM105 and LM205 are separated by 50 nanometers, and the lines LM106 and LM206 are in electrical contact.

After diffusion of the metallic species, and after a measurement of the resistance for each pair of lines, an approximation of the diffusion length of the metallic species can be obtained to within 50 nanometers. For example, if the resistances measured between the locations E16 and E26, E15 and E25, E14 and E24 are low, and if the resistances measured between the locations E13 and E23, E11 and E22, E11 and E21 are high, then the diffusion length of the metallic species lies between 150 and 100 nanometers since an electrical contact has not been formed by diffusion between the lines LM103 and LM203, which are separated by 150 nanometers.

FIG. B schematically represents another embodiment in which the metallic lines LM111-LM121 and LM211-LM221 form pairs of lines intended to be separated by a spacing ranging, for example, from 500 nanometers for the lines LM111 and LM211 to −500 nanometers (that is to say an overlap of at least 500 nanometers) for the lines LM121 and LM221. Thus, a prior measurement of the resistance makes it possible to detect an alignment error along at least one direction, and to do so to within 100 nanometers if the spacing between the lines varies with an increment of 100 nanometers. It is then possible to carry out diffusion of the metallic species of the lines and take into account the alignment error during the estimation of the diffusion length.

It will be noted that the metallic lines described above may be arranged within a test structure sharing the same semiconductor support as a three-dimensional integrated structure. The invention is not limited to the embodiments and implementations described above, and encompasses all variants thereof. Thus, it is possible to obviate production of the cavities and to use other connections for placing a measuring apparatus in electrical contact with the two locations. It is possible, in particular, to use connections of the TSV type, which make it possible to electrically connect a measuring apparatus to lines buried within a three-dimensional structure to estimate the diffusion length of the metallic species of these lines, without rendering this structure unusable. Furthermore, it is also possible to use a single cavity formed according to the method described above, in combination with a connection of the TSV type to estimate the diffusion length.

That which is claimed:

1. A method for estimating a diffusion length of a metallic species between a pair of metallic lines, each included within a respective one of a pair of integrated circuits of a three-dimensional integrated structure, the method comprising:
   diffusing the metallic species in the pair of metallic lines;
   placing a measuring apparatus in electrical contact with each of the pair of metallic lines;
   measuring a resistance based upon the electrical contact with the pair of metallic lines; and
   providing an estimate of the diffusion length based upon the measured resistance.

2. The method according to claim 1, further comprising, prior to measuring the resistance, forming a plurality of cavities passing through one of the pair of integrated circuits and opening onto electrical contact locations with the pair of metallic lines; and wherein placing the measuring apparatus comprises placing the measuring apparatus in electrical contact with the pair of metallic lines at a bottom of each of the plurality of cavities.

3. The method according to claim 1, wherein the diffusion of the metallic species comprises an annealing of the metallic species.

4. The method according to claim 1, wherein the diffusion of the metallic species comprises applying an electrical potential difference between the pair of metallic lines.

5. The method according to claim 1, further comprising measuring a resistance based upon the electrical contact with the pair of metallic lines prior to the diffusion of the metallic species.

6. The method according to claim 2, further comprising forming a conductive layer at the bottom of and on walls of each of the plurality of cavities.

7. The method according to claim 2, wherein placing the measuring apparatus comprises placing each of a pair of probe tips of the measuring device in electrical contact with respective ones of the pair of metallic lines.

8. The method according to claim 2, wherein placing the measuring apparatus comprises placing each of a pair of welded wires at the bottom of respective ones of the pair of cavities.

9. A method for estimating a diffusion length of a metallic species between a pair of metallic lines, each included within a respective one of a pair of assembled integrated circuits of a three-dimensional integrated structure, the method comprising:

diffusing the metallic species in the pair of metallic lines;

forming a plurality of cavities passing through one of the pair of assembled integrated circuits and opening onto electrical contact locations with the pair of metallic lines;

placing a measuring apparatus in electrical contact with each of the pair of metallic lines at the electrical contact locations;

measuring a resistance based upon the electrical contact with the pair of metallic lines at a bottom of each of the plurality of cavities; and providing an estimate of the diffusion length based upon the measured resistance.

10. The method according to claim 9, wherein the plurality of cavities are formed prior to measuring the resistance.

11. The method according to claim 9, wherein the diffusion of the metallic species comprises an annealing of the metallic species.

12. The method according to claim 9, wherein the diffusion of the metallic species comprises applying an electrical potential difference between the pair of metallic lines.

13. The method according to claim 9, further comprising measuring a resistance based upon the electrical contact with the pair of metallic lines prior to the diffusion of the metallic species.

14. The method according to claim 9, further comprising forming a conductive layer at the bottom of and on walls of each of the plurality of cavities.

15. The method according to claim 9, wherein placing the measuring apparatus comprises placing each of pair of probe tips of the measuring device in electrical contact with respective ones of the pair of metallic lines.

16. The method according to claim 9, wherein placing the measuring apparatus comprises placing each of a pair of welded wires at the bottom of respective ones of the pair of cavities.

* * * * *